United States Patent [19]

Raber et al.

[11] Patent Number: 5,656,380

[45] Date of Patent: Aug. 12, 1997

[54] SUPERCONDUCTIVE ARTICLE AND METHOD OF MAKING

[75] Inventors: Thomas Robert Raber, East Berne; Mark Gilbert Benz, Burnt Hills; Howard Roscoe Hart, Jr., Schenectady, all of N.Y.

[73] Assignee: General Electric Company, Schenectady, N.Y.

[21] Appl. No.: 406,443

[22] Filed: Mar. 20, 1995

[51] Int. Cl.$^6$ .......................... G12B 17/02; B32B 3/10; B32B 7/04

[52] U.S. Cl. .......................... 428/608; 428/662; 428/930; 29/599; 174/35 MS; 505/813; 505/925; 505/927

[58] Field of Search .......................... 428/594, 608, 428/930, 660, 661, 662; 29/599; 174/35 MS; 505/812, 813, 918, 919, 925, 927, 926

[56] References Cited

U.S. PATENT DOCUMENTS

| | | | |
|---|---|---|---|
| 3,416,917 | 12/1968 | De Sorbo | 428/930 |
| 3,429,032 | 2/1969 | Martin et al. | 428/627 |
| 3,473,217 | 10/1969 | Prior | 29/599 |
| 3,537,827 | 11/1970 | Benz et al. | 505/812 |
| 3,603,716 | 9/1971 | Koren | 174/35 MS |
| 3,661,639 | 5/1972 | Caslaw | 505/821 |
| 3,728,165 | 4/1973 | Howlett | 428/930 |
| 4,126,287 | 11/1978 | Mendelsohn et al. | 174/35 MS |
| 4,161,062 | 7/1979 | Agatsuma et al. | 505/927 |
| 5,104,030 | 4/1992 | Ranze | 505/927 |
| 5,109,593 | 5/1992 | Benz et al. | 29/599 |
| 5,117,065 | 5/1992 | Savage | 174/35 MS |
| 5,134,040 | 7/1992 | Benz et al. | 505/927 |
| 5,239,156 | 8/1993 | Jones et al. | 219/121.63 |
| 5,373,275 | 12/1994 | Itoh et al. | 174/35 MS |

FOREIGN PATENT DOCUMENTS

| | | | |
|---|---|---|---|
| 1-260895 | 10/1989 | Japan | 174/35 MS |
| 4-10698 | 1/1992 | Japan | 174/35 MS |
| 6-224591 | 8/1994 | Japan | 174/35 MS |
| WO 86/05062 | 8/1986 | WIPO | 174/35 MS |

OTHER PUBLICATIONS

J.S. Caslaw, "Enhancement of the critical current density in niobium–tin", Cryogenics, Feb. 1971, pp. 57–59.

M.G. Benz, "Superconducting Properties of Diffusion Processed Niobium–Tin Tape", IEEE Transactions on Magnetics, v. MAG–2, No. 4, Dec. 1966, pp. 760–764.

M.G. Benz, et al., "Melt–Formed Superconducting Joints for Nb3Sn Tape", Journal of Electronic Materials, vol. 22, No. 10, Jun. 1993, pp. 1299–1303.

Primary Examiner—John Zimmerman
Attorney, Agent, or Firm—Ernest G. Cusick; William H. Pittman

[57] ABSTRACT

A superconductive article is made from interwoven superconductive, metallic tapes. The interwoven tapes are electrically interconnected by a plurality of superconductive interconnections that extend between the interwoven tapes. Articles of the invention may be formed from tapes comprising superconductive $Nb_3Sn$ having $Nb_3Sn$ interconnections.

17 Claims, 5 Drawing Sheets

SUPERCONDUCTIVE ARTICLE AND METHOD OF MAKING

FIELD OF THE INVENTION

This invention is related generally to articles made from metallic superconductors. Specifically, this invention comprises superconductive metallic articles that are formed from interwoven and interconnected superconductive, metallic ropes.

BACKGROUND OF THE INVENTION

Superconductivity is that characteristic of certain materials which permits them to conduct electric currents without resistance. A superconducting material exhibits this characteristic only when its temperature is below the superconducting critical temperature of the material and then only if it is not subject either to a magnetic field greater than the superconducting critical magnetic field of the material or to an electric current greater than the superconducting critical current of the material. Accordingly, a superconductive material can be quenched (i.e. returned to a resistive state) by increasing the temperature, magnetic field, or current to which the material is subjected above the critical temperature, critical magnetic field, or critical current. In a given material, quenching of the superconductivity may occur abruptly or more gradually depending upon the breadth of its superconducting transition state with respect to temperature, magnetic field or current.

Briefly stated, with regard to metallic superconductors it is known that selected parent-metals, either pure or preferably containing minor solute-metal alloying additions, are capable of being alloyed with other reactive-metals and forming superconducting compounds or alloys that have a high current-carrying capacity. The parent-metals niobium, tantalum, technetium, and vanadium can be reacted or alloyed with reactive-metals, such as tin, aluminum, silicon, and gallium to form superconducting alloys, such as the intermetallic $Nb_3Sn$.

Additionally, it is known that the superconductive characteristics of various parent-metals can be improved by first alloying the parent-metal, i.e., niobium, tantalum, technetium, and vanadium, with a minor amount of a solute-metal having an atom diameter of at least 0.29 angstroms larger than the diameter of the parent-metal atom prior to reacting the reactive-metal with the parent-metal. A broad disclosure of various parent-metals, solute-metals, and reactive-metals can be found in U.S. Pat. No. 3,416,917, which is incorporated herein by reference. Of the various possible combinations of the materials mentioned above, it is known that niobium is an extremely useful parent-metal, particularly when reacted with the reactive-metal, tin to form $Nb_3Sn$. This intermetallic compound has superior superconducting properties. More specifically, U.S. Pat. No. 3,429,032, which is incorporated herein by reference, discloses improved critical currents in superconductive $Nb_3Sn$ alloys formed when the parent-metal niobium also contains zirconium, in an amount of at least 0.1 weight percent and up to an amount equivalent to the ratio represented by the formula $Nb_2Zr$, and is heated in the presence of excess tin, and a non-metal selected from the group consisting of oxygen, nitrogen, and carbon.

Metallic superconductors, particularly those comprising $Nb_3Sn$, have been fabricated in various forms, particularly wires and tapes, in efforts to produce devices such as high field superconducting electromagnets. Superconductive metallic devices of laminated construction having an elongated tape or strip configuration and the methods of producing such superconductive tapes are well known. For example, U.S. Pat. No. 3,661,639, incorporated by reference herein, discloses improved superconductive tapes, and methods of forming the improved tapes. U.S. Pat. No. 3,537,827, incorporated by reference herein, discloses improvements in laminating superconductive tapes and methods for producing the laminated tapes. One method for obtaining superconducting tape in a continuous fashion is that wherein a tape of a preselected parent-metal, such as niobium or niobium alloy, (e.g. an Nb—Zr—O alloy) is continuously led through a bath of molten reactive-metal such as tin or a tin alloy, such as a tin-copper alloy. The niobium tape picks up a thin coating of the reactive-metal from the molten bath and the tape is subsequently heated in a reaction furnace to cause formation of the superconductive $Nb_3Sn$ alloy on the surface of the parent-metal tape. It is also known that the reactive-metals can be alloyed to further improve the superconductive tape. For example, the critical current density of $Nb_3Sn$ has been improved by making copper additions of up to 45 weight percent copper in the reactive-metal tin for coating on niobium tape as disclosed in, "Enhancement of the Critical Current Density in Niobium-Tin" J. S. Caslaw, Cryogenics, February 1971, pp. 57–59.

Methods for making superconductive joints between superconductive tapes, such as $Nb_3Sn$ tapes, are well-known as described in U.S. Pat. Nos. 5,109,593, 5,134,040 and 5,239,156. Most of the development of joining techniques related to superconductive tapes appears to have been directed toward joining techniques for forming continuous lengths of tape. However, it is also desirable to form larger superconductive articles from these tapes. For example, larger superconductive articles made from these superconductive tapes could be used for electromagnetic shielding for sensitive electromagnetic devices that must be isolated from large magnetic fields. Therefore, it is desirable to fashion superconductive tapes into larger superconductive articles.

SUMMARY OF THE INVENTION

This invention describes superconductive articles that are formed from interwoven and interconnected superconductive tapes, such as those comprising $Nb_3Sn$. The invention also comprises a method of making such articles.

The present invention may be described as a woven superconductive article, comprising: a plurality of first superconductive, metallic tapes oriented in a first direction (first tapes); a plurality of second superconductive, metallic tapes oriented in a second direction (second tapes), said first tapes and said second tapes interwoven with one another to form an article having a plurality of overlapping regions where first tapes and second tapes cross over or under one another; and a plurality of superconductive interconnections between said first tapes and said second tapes in the plurality of overlapping regions.

One method of making these superconductive articles, may be described as comprising the steps of: weaving a plurality of first precursor tapes together with a plurality of second precursor tapes to form an article having a plurality of overlapping regions; heating the plurality of first precursor tapes and the plurality of second precursor tapes at a temperature and for a time sufficient to cause them to form a plurality of first superconductive tapes comprising a first superconductive material and a plurality of second superconductive tapes comprising a second superconductive material, respectively; and forming a plurality of superconductive interconnections in the overlapping regions between the first superconductive tapes and the second superconductive tapes.

A principal advantage of the present invention is that it permits the creation of superconductive articles that are larger than those that may be fashioned from a single superconductive tape.

DETAILED DESCRIPTION OF THE INVENTION

This invention describes a woven superconductive article that is formed by weaving together and electrically interconnecting a plurality of superconductive tapes. Superconductive articles of the present invention may be made in a variety of shapes and sizes including flat, planar arrays and shapes that may be formed from such arrays, such as a hollow right circular cylinder.

Figure 1:
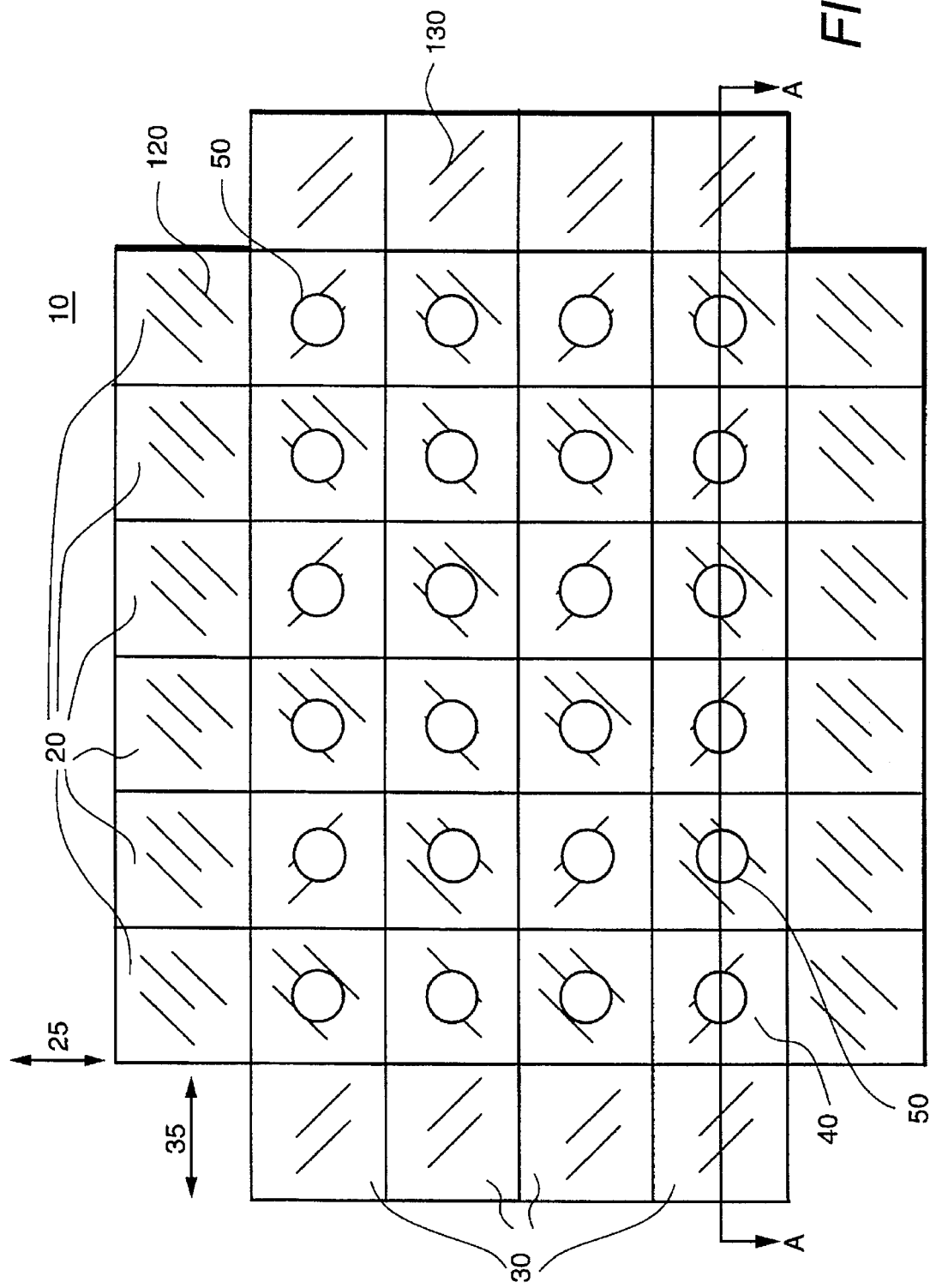
FIG. 1 is an illustration of a top view of a superconductive article of the present invention.

FIG. 1 illustrates one embodiment of a woven superconductive article 10 of the present invention in the form of a flat, planar array. Superconductive article 10 comprises a plurality of first superconductive, metallic tapes 20 oriented in a first direction 25 (first tapes 20); a plurality of second superconductive, metallic tapes 30 oriented in a second direction 35 (second tapes 30), said first tapes 20 and said second tapes 30 interwoven with one another to form an article having a plurality of overlapping regions 40 where first tapes 20 and second tapes 30 cross over or under one another, and a plurality of superconductive interconnections 50 between said first tapes 20 and said second tapes 30 in the plurality of overlapping regions 40.

First tapes 20 and second tapes 30 are metallic superconductors of a type well known in the art. They may comprise any superconductive metallic material, but are preferably from the group consisting of niobium-base, tantalum-base, technetium-base and vanadium-base alloys with at least one alloy constituent from the group consisting of tin, aluminum, silicon and gallium. Tapes comprising the superconductive metallic material $Nb_3Sn$ are preferred, primarily due to the commercial availability and superconductive characteristics of this material, and are used herein as the illustrative embodiment of the present invention.

Figure 2A:
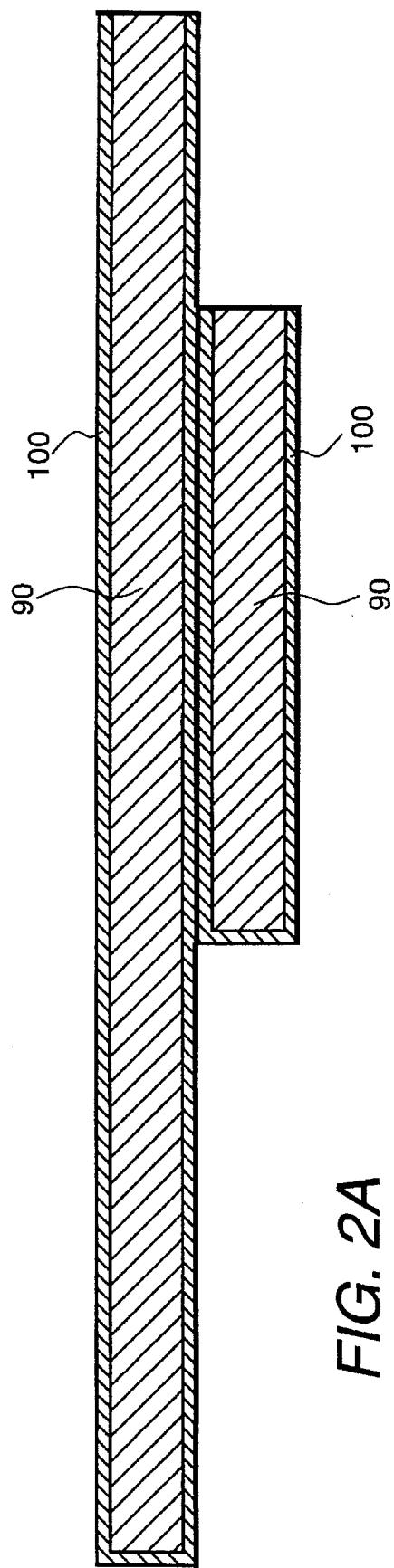
FIG. 2A is a cross-sectional view of the article of FIG. 2 taken along section line AA.
Figure 2:
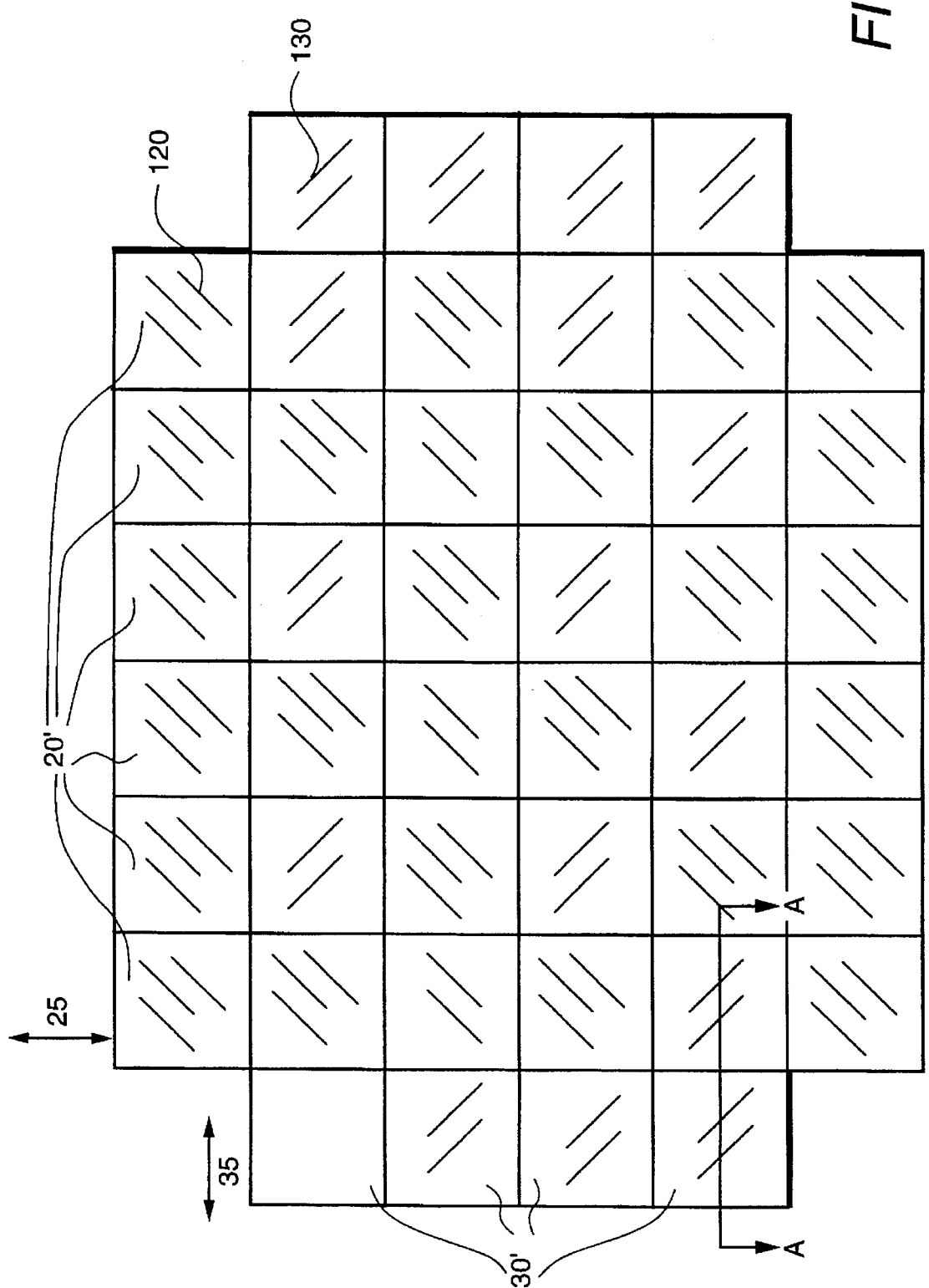
FIG. 2 is an illustration of a top view of a woven structure of precursor tapes.

Superconductive $Nb_3Sn$ tapes are well known in the art being described, for example, in "Superconducting Properties of Diffusion Processed Niobium-Tin Tape", M. Benz, I.E.E.E. Transactions of Magnetics, Vol. Mag-2 No. 4, December 1966, pp. 760–764. Superconductive $Nb_3Sn$ tapes are formed from precursor tapes that comprise niobium coated with tin. FIGS. 2 and 2A illustrate a woven precursor article comprising unreacted first precursor tapes 20' and second precursor tapes 30' that each comprise a niobium-base tape 90 and a tin or a tin alloy reactive-metal coating 100. The parent-metal niobium-base tape 90 also typically has solute-metal additions of zirconium (not shown). Niobium-base tape 90 is preferably an alloy of up to about 5 atomic percent zirconium, up to about 10 atomic percent oxygen and a balance of niobium, and most preferably an alloy of about 1 atomic percent zirconium, 2 atomic percent oxygen and a balance of niobium. The addition of zirconium and oxygen are known to improve the critical current density in the resulting $Nb_3Sn$. Tin coating 100 may be a pure tin coating, but is preferably a tin-copper alloy coating comprising up to about 45 atomic percent copper and the balance tin, excepting impurities, and is most preferably an alloy coating comprising about 32 atomic percent copper and the balance tin, excepting impurities. Tin or tin alloy coating 100 is frequently applied to both sides of the niobium-base tape 90 by passing the tape through a melt of the tin or tin alloy. This tin-coated niobium-base tape is referred to as an "unreacted tape", and is designated in FIG. 2 as first precursor tapes 20' and second precursor tapes 30'. These unreacted tapes require an additional reactive step to form the superconductive $Nb_3Sn$.

Figure 1A:
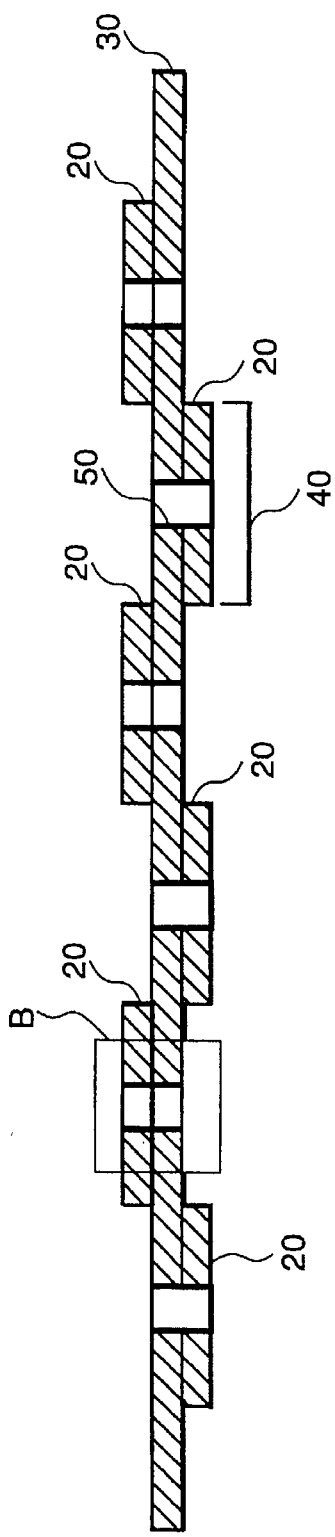
FIG. 1A is a cross-sectional view of the article of FIG. 1 taken along section line AA.
Figure 1B:
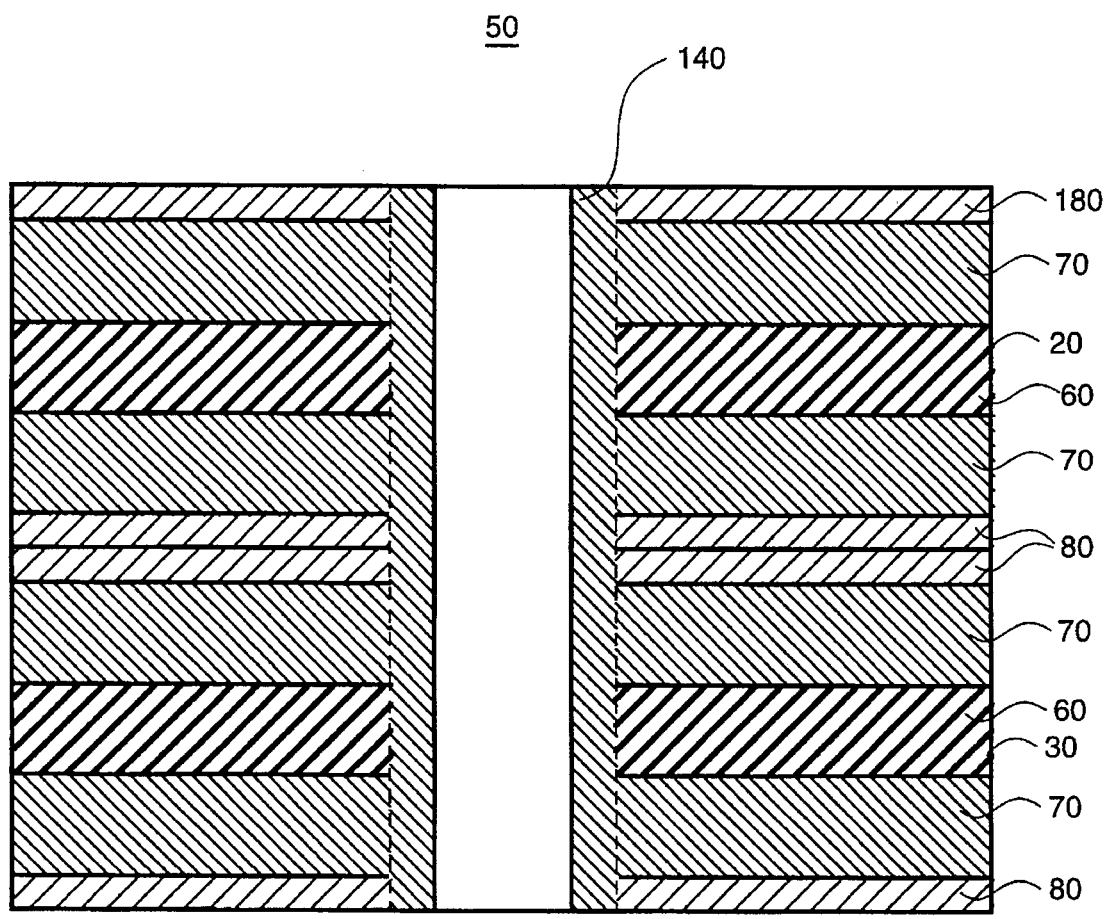
FIG. 1B is an enlargement of area B as shown in FIG. 1A.

The reactive step is typically an anneal in an argon atmosphere at a temperature of about 950°–1150° C. Depending on factors such as the thickness of the unreacted niobium-base tape and the desired thickness of the $Nb_3Sn$ reaction layers, the reaction may require 2–5 minutes or more. FIGS. 1A and 1B illustrate reacted tapes in the form of first tapes 20 and second tapes 30. A typical example of a reacted tape has a thickness of about 33 microns. This includes a core 60 of the remaining parent-metal niobium-base alloy having a thickness of about 11 microns, a layer of $Nb_3Sn$ 70 on either side of the core 60 having a thickness of about 8 microns and a layer 80 of the unreacted tin or tin alloy covering both of the $Nb_3Sn$ 70 layers having a thickness of about 3 microns. Having described how superconductive first tapes 20 and second tapes 30 are formed, superconductive article 10 and a method of making this article are now described.

Figure 3:
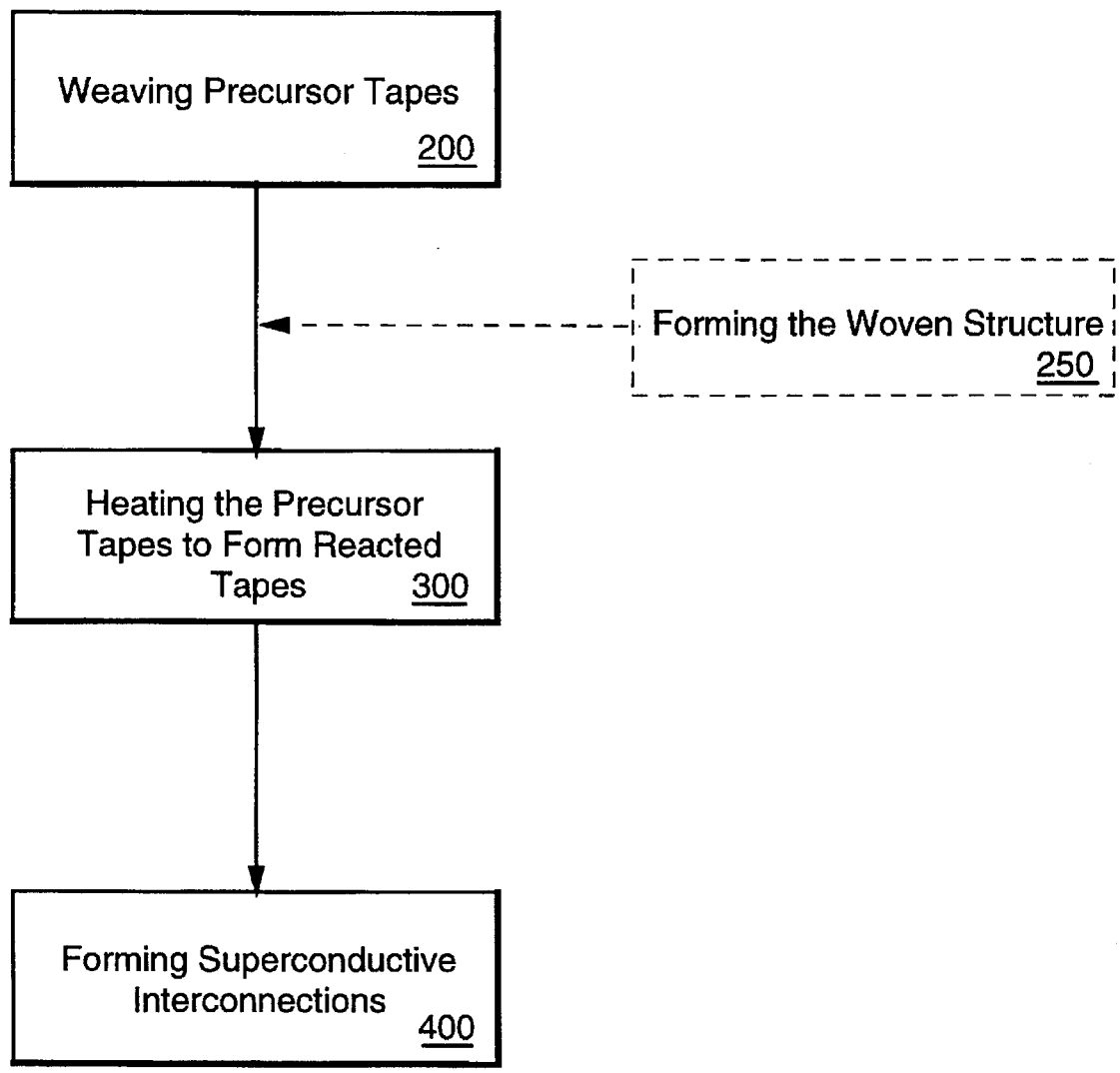
FIG. 3 is a flow diagram describing the method of the invention.

FIG. 3 illustrates the steps of a method of making a woven superconductive article 10. Referring to FIGS. 1–3, the method briefly comprises: weaving 200 a plurality of first precursor tapes 20' together with a plurality of second precursor tapes 30' to form a plurality of overlapping regions 40; heating 300 the plurality at first precursor tapes 20' and second precursor tapes 30' at a temperature and for a time sufficient to cause them to form an article having a plurality of first superconductive tapes 20 comprising a first superconductive material and a plurality of second superconductive tapes 30 comprising a second superconductive material, respectively; and forming 400 a plurality of superconductive interconnections 50 in the overlapping regions 40 between the first superconductive tapes 20 and the second superconductive tapes 30. Optionally, this method may also comprise the additional step of forming 250 the woven structure comprising the plurality of first precursor tapes 20' and plurality of second precursor tapes 30' prior to the step of heating 300.

In one embodiment shown in FIGS. 2 and 2A, an unreacted article of the present invention is interwoven into a flat, planar array. FIG. 2 illustrates a pattern where a plurality of first precursor tapes 20' are interwoven among a plurality of second precursor tapes 30'. First precursor tapes 20' and second precursor tapes 30' may be any precursor materials for a metallic superconductive material, but have been selected for this illustrative embodiment to be niobium-base alloys as described above as a parent-metal 90, having a tin or tin alloy as a reactive-metal coating 100. These tapes are woven in an unreacted state, because it is known that the Nb$_3$Sn in reacted tapes is brittle. In the embodiment of FIG. 2, each first precursor tape 20' crosses over and then under adjacent second precursor tapes 30' in a repeating pattern. Adjacent first precursor tapes 20' are reversed with respect to their over and under weaving pattern. This alternation in the pattern is indicated in FIG. 2 by cross-hatching patterns 110 and 120 which indicate whether a first precursor tape 20' or a second precursor tape 30', respectively, is visible when viewed from above. The result is a woven array of precursor tapes 20' and 30'. The step of weaving 200 the pattern shown in FIG. 2 and other possible patterns of the present invention may be done using any suitable weaving means and/or methods, including weaving by hand. In the embodiment of FIG. 2, tape directions 25 and 35 are orthogonal, but weaving 200 may be done so as to produce a non-orthogonal weave. The weaving pattern illustrated in FIG. 2 is a closed pattern, where adjacent tapes are placed as closely together as possible. However, more open weaving patterns, having varying amounts of space between adjacent tapes are also possible. Many additional weaving patterns are also possible, including patterns that utilize more than two orientations of tapes.

In the woven and unreacted state, the array of precursor tapes 20' and 30' may optionally be formed 250 into any number of known shapes that may be formed from such an array, including for example a right circular cylinder or a cone. Forming 250 may be done by weaving the desired form directly, or by other suitable methods such as bending, stamping or other methods, and may be done by hand or using mechanical means.

Once weaving 200 and any desired forming 250 is done, the plurality of first precursor tapes 20' and the plurality of second precursor tapes 30' may be reacted using the methods described herein to form the first tapes 20 and second tapes 30 comprising superconductive Nb$_3$Sn. At this point, each of the individual tapes of the article are superconductive, but the article taken as a whole is not yet considered to be superconductive in the context of this invention, because an induced electrical current, such as an induced eddy current, would not be free to move across the surface of the article from one tape to another in a superconductive manner, i.e., free from the normal resistive losses that would be associated with a metallic conductor. This is because superconductive interconnections 50 between adjacent first tapes 20 and second tapes 30 have not yet been formed.

In order to make the article taken as a whole superconductive, it is necessary to make a plurality of superconductive interconnections 50 between adjacent first tapes 20 and second tapes 30 in a plurality of the overlapping regions 40. A superconductive interconnection 50 is illustrated in FIGS. 1A and 1B. Superconductive interconnections 50 comprise a continuous layer of Nb$_3$Sn 140 that connects the superconductive Nb$_3$Sn 70 of first tapes 20 with the superconductive Nb$_3$Sn 70 of second tapes 30. The superconductive interconnections 50 and the method of forming 400 these superconductive interconnections 50 are similar to those described in U.S. Pat. Nos. 5,109,593, 5,134,040 and 5,239,156, which are hereby incorporated by reference. However, rather than forming butt joint interconnections as described in the referenced patents, it is possible to form through-hole superconductive interconnections 50 by using a combination of an upper and a lower copper chill plate (not shown). These chill plates each contain a bore that extends through the plate. In use, the chill plates are aligned such that the bores in the two plates are directly in line with one another, with an overlapping region 40 of a first tape 20 and a second tape 30 pressed in between so as to establish good thermal contact between the chill plates and the tapes, thereby allowing the chill plates to dissipate heat produced during the formation of the superconductive interconnection 50. A tungsten inert gas (TIG) welding electrode and apparatus may then be utilized to melt the portion of the overlapping region 40 that is exposed within the bores of the chill plates. The TIG arrangement permits this melting to be done in an protective atmosphere, such as an argon atmosphere. The zone within the bore is melted, and surface tension and other effects cause the molten material to pull back forming a ring of material that resolidifies upon cooling. The ring of resolidified material comprises Nb$_3$Sn layer 140 that connects first tape 20 and second tape 30 to form superconductive interconnection 50.

The degree of superconductivity of an article 10 can be varied by the number, size and spacing of the plurality of superconductive interconnections 50 that are formed. For example, if the article 10 is used as a magnetic shield, increasing the spacing of the superconductive interconnections 50 may increase the path length of induced surface currents, particularly in situations where such currents seek to follow a path that may not be contained within a particular tape, thus requiring cross-over from a tape oriented in one direction to a tape oriented in a different direction through a superconductive interconnection 50.

EXAMPLE 1

A plurality of one inch wide, 25 micron thick niobium tapes were used to form an article of the present invention. The composition of these tapes was approximately 1 atom percent zirconium, 2 atom percent oxygen and a balance of niobium. These tapes were coated with a layer of a tin-copper alloy by brief immersion in a molten bath that was held at a temperature of about 1050° C. The bath comprised about 10 weight percent copper with a balance of tin. The plurality of coated but unreacted tapes were then woven into a configuration similar to that shown in FIG. 2. After weaving, the tapes were reacted by heating in an argon atmosphere at about 1050° C. for 220 seconds. After reaction, the reacted tapes had a remaining core of the original niobium alloy that ranged between 5.4 and 19.4 microns in thickness, because the process had not been optimized to make the reaction uniform. It would have been preferred to control the thickness of the remaining core to approximately 10–13 microns in thickness. The thickness of the Nb$_3$Sn reaction layers on either side of the core was between 3–10 microns because of the non-optimized reaction process. A thickness of 6–8 microns would have been more preferred. The outer layers of remaining tin-copper alloy were approximately 2–3 microns thick. The reacted tapes were then interconnected in a plurality of the overlapping regions using chill plates and a TIG welding apparatus as described above to produce a superconductive article.

EXAMPLE 2

The superconductive character of the interconnections was also tested to ensure that the articles were truly superconductive. This was done by overlapping pieces of 10.3 mm wide reacted tape and forming a plurality of interconnections having different diameters between them using the TIG welding method described above. The critical currents of these interconnections were then measured at a temperature of 4.2° K. in a magnetic field of 5 T. The resulting data are shown in Table 1 below:

TABLE 1

| Interconnection Dia. (Bore Dia.) (mm) | Critical Current (Ic) (amps) |
| --- | --- |
| 4.8 | >600 |
| 4.1 | 485 |
| 2.8 | 345 |
| 2.0 | 350 |

This data indicates that the interconnections formed using a combination of TIG welding and chill plates are truly superconductive, and that a plurality of such interconnections may be used to form superconductive articles of the present invention.

What is claimed is:

1. A woven superconductive article, comprising:

a plurality of first tapes which are superconductive, metallic tapes oriented in a first direction;

a plurality of second tapes which are superconductive, metallic tapes oriented in a second direction, said first tapes and said second tapes interwoven with one another to form an article having a plurality of overlapping regions where first tapes and second tapes cross over or under one another; and a plurality of superconductive interconnections between said first tapes and said second tapes in the plurality of overlapping regions.

2. The woven superconductive article of claim 1, wherein said first tapes and said second tapes are from the group consisting of niobium-base, tantalum-base, technetium-base and vanadium-base alloys with at least one alloy constituent from the group consisting of tin, aluminum, silicon and gallium.

3. The woven superconductive article of claim 1, wherein said first tapes said second tapes comprise an alloy of up to about 5 atomic percent zirconium, up to about 10 atomic percent oxygen and a balance of niobium coated with an alloy comprising up to about 40 atomic percent copper and the balance tin.

4. The woven superconductive article of claim 1, wherein said first tapes said second tapes comprise $Nb_3Sn$.

5. The woven superconductive article of claim 1, wherein the first direction is orthogonal to the second direction.

6. The woven superconductive article of claim 1, wherein 50–100 percent of the plurality of overlapping regions have at least one superconductive interconnection.

7. The woven superconductive article of claim 1, wherein said superconductive interconnections comprise a continuous precipitate of a superconductive compound between said first tapes and said second tapes.

8. The woven superconductive article of claim 7, wherein said superconductive interconnections comprise welds between said first tapes and said second tapes.

9. The woven superconductive article of claim 1, wherein the superconductive interconnections comprise diffusion bonds between said first tapes and said second tapes.

10. A woven superconductive article, comprising:

a plurality of first tapes which are metallic tapes comprising $Nb_3Sn$ and which are oriented in a first direction such that the tapes are substantially parallel and comprise a substantially planar surface;

a plurality of second tapes which are metallic tapes comprising $Nb_3Sn$ and which are oriented in a second direction such that the tapes are substantially parallel and comprise a substantially planar surface, said first tapes and said second tapes interwoven with one another and having a plurality of overlapping regions wherein tapes of the first direction and second direction cross over or under one another; and a plurality of superconductive interconnections between said first tapes and said second tapes in the plurality of overlapping regions.

11. The woven superconductive article of claim 10, wherein said superconductive interconnections comprise a continuous layer of $Nb_3Sn$ between said first tapes and said second tapes.

12. The woven superconductive article of claim 10, wherein said superconductive interconnections comprise welds joining the tapes of the first direction with the tapes of the second direction within the overlapping regions.

13. The woven superconductive article of claim 10, wherein said superconductive interconnections comprise diffusion bonds joining the tapes of the first direction with the tapes of the second direction within the overlapping regions.

14. A method of making a superconductive article, comprising the steps of:

weaving a plurality of first precursor tapes together with a plurality of second precursor tapes to form an article having a plurality of overlapping regions;

heating the plurality of first precursor tapes and the plurality of second precursor tapes at a temperature and for a time sufficient to cause them to form a plurality of first superconductive tapes comprising a first superconductive material and a plurality of second superconductive tapes comprising a second superconductive material, respectively; and forming a plurality of superconductive interconnections in the overlapping regions between the first superconductive tapes and the second superconductive tapes.

15. The method of claim 14, wherein the first superconductive material and the second superconductive are the same material.

16. The method of claim 15, wherein the first and second superconductive materials comprise $Nb_3Sn$.

17. The method of claim 14, wherein the plurality of superconductive interconnections comprise $Nb_3Sn$.

* * * * *